(12) United States Patent
Janjua et al.

(10) Patent No.: US 10,867,673 B2
(45) Date of Patent: Dec. 15, 2020

(54) NONVOLATILE MEMORY DEVICE INCLUDING TRANSFER ELEMENT

(71) Applicant: SAMSUNG ELECTRONICS CO., LTD., Suwon-si (KR)

(72) Inventors: Bilal Ahmad Janjua, Suwon-si (KR); Vivek Venkata Kalluru, Suwon-si (KR); June-Hong Park, Seongnam-si (KR); Jungyu Lee, Hwaseong-si (KR); Ji-Hoon Lim, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/543,528

(22) Filed: Aug. 17, 2019

(65) Prior Publication Data

US 2020/0152265 A1   May 14, 2020

(30) Foreign Application Priority Data

Nov. 8, 2018   (KR) .................. 10-2018-0136490

(51) Int. Cl.
  *G11C 11/00*  (2006.01)
  *G11C 13/00*  (2006.01)

(52) U.S. Cl.
  CPC ...... *G11C 13/0069* (2013.01); *G11C 13/0004* (2013.01); *G11C 13/0038* (2013.01); *G11C 2013/0078* (2013.01); *G11C 2213/72* (2013.01); *G11C 2213/75* (2013.01); *G11C 2213/79* (2013.01)

(58) Field of Classification Search
  CPC ............ G11C 13/0004; G11C 13/0038; G11C 13/0069

USPC .................................................. 365/148, 163
See application file for complete search history.

(56) References Cited

U.S. PATENT DOCUMENTS

| | | | |
|---|---|---|---|
| 6,418,046 B1* | 7/2002 | Naji ....................... | G11C 11/16 365/158 |
| 6,680,865 B2 | 1/2004 | Watanabe | |
| 6,842,365 B1 | 1/2005 | Nahas et al. | |
| 6,850,430 B1* | 2/2005 | Perner .................... | G11C 11/16 365/158 |
| 9,269,442 B2 | 2/2016 | Cunningham et al. | |
| 9,280,168 B2 | 3/2016 | Dayley et al. | |
| 9,281,061 B2 | 3/2016 | Di Vincenzo et al. | |
| 9,355,720 B2 | 5/2016 | Ann et al. | |
| 2012/0307547 A1* | 12/2012 | Park ..................... | G11C 13/0069 365/148 |
| 2014/0198556 A1* | 7/2014 | Lee ........................ | G11C 13/004 365/148 |
| 2017/0345475 A1* | 11/2017 | Lee ........................ | G11C 11/005 |

FOREIGN PATENT DOCUMENTS

KR    20130123908 A    11/2013

* cited by examiner

*Primary Examiner* — Hoai V Ho
*Assistant Examiner* — Minh Dinh
(74) *Attorney, Agent, or Firm* — Volentine, Whitt & Francos, PLLC

(57) ABSTRACT

A nonvolatile memory device includes a bank and a program current generator. The bank includes a memory cell array that includes phase change memory cells storing data based on a program current, and the transfer element transfers the program current to the memory cell array through current mirroring. The program current generator generates the program current based on a reference current.

17 Claims, 12 Drawing Sheets

NONVOLATILE MEMORY DEVICE INCLUDING TRANSFER ELEMENT

CROSS-REFERENCE TO RELATED APPLICATIONS

A claim of priority under 35 U.S.C. § 119 is made to Korean Patent Application No. 10-2018-0136490 filed on Nov. 8, 2018, in the Korean Intellectual Property Office, the entire content of which is hereby incorporated by reference.

BACKGROUND

The present inventive concepts herein relate to semiconductor memory, and more particularly to nonvolatile memory devices including a transfer element.

Semiconductor memory may include nonvolatile memory such as for example phase change memory, ferroelectric memory, magnetic memory, resistive memory, and flash memory. Phase change memory in particular is configured so that resistance values of memory cells are changed using current. That is, a write operation of memory cells in phase change memory may be based on program current corresponding to a set operation or a reset operation.

Memory cells may be arranged two-dimensionally. However, an optimized program current for a write operation may vary with relative locations of the memory cells. If an identical program current corresponding to the set operation is applied to all the two-dimensionally arranged memory cells, or if an identical program current corresponding to the reset operation is applied to all the two-dimensionally arranged memory cells, a write operation may not be performed or an error may occur during the write operation depending on locations of the memory cells. Accordingly, there is a need to improve reliability of write operations of nonvolatile memory devices.

SUMMARY

Embodiments of the inventive concept provide a nonvolatile memory device including a transfer element which may improve accuracy and reliability during a write operation and may decrease error during the write operation.

Embodiments of the inventive concepts provide a nonvolatile memory device including a bank and a program current generator. The bank includes a memory cell array that includes phase change memory cells storing data based on a program current. The transfer element transfers the program current to the memory cell array through current mirroring. The program current generator generates the program current based on a reference current.

Embodiments of the inventive concepts further provide a nonvolatile memory device including a peripheral circuit and a bank. The peripheral circuit includes a program current generator that generates a program current based on a reference current. The bank includes a memory cell array, a transfer element that receives the program current from the program current generator, and a write driver that mirrors the program current from the transfer element and performs a write operation on a selected memory cell of the memory cell array.

Embodiments of the inventive concepts still further provide a nonvolatile memory device including a first floor including a first bank performing a write operation based on a first program current; a second floor including a second bank performing a write operation based on a second program current, the second floor positioned over the first floor; a program current generator configured to generate the first program current and the second program current based on a reference current; a first transfer element configured to transfer the first program current received from the program current generator to the first bank through current mirroring; and a second transfer element configured to transfer the second program current received from the program current generator to the second bank through current mirroring.

BRIEF DESCRIPTION OF THE FIGURES

The above and other objects and features of the inventive concepts will become apparent in view of the following detailed description of exemplary embodiments with reference to the accompanying drawings.

DETAILED DESCRIPTION

Hereinafter, embodiments of the inventive concepts will be described clearly and in detail with reference to the accompanying drawings to such an extent that one of ordinary skill in the art may implement embodiments of the inventive concepts.

As is traditional in the field of the inventive concepts, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

Figure 1:
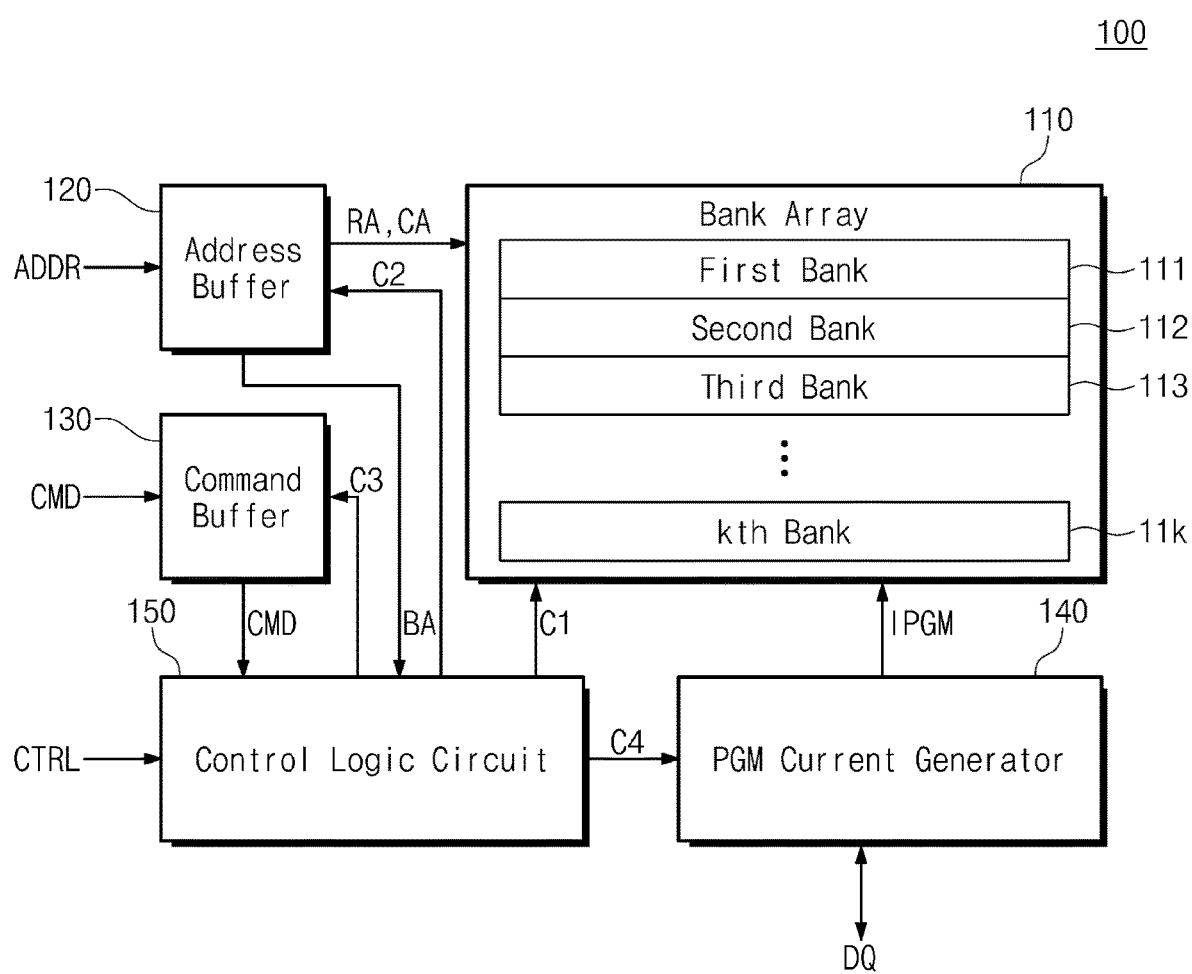
FIG. 1 illustrates a block diagram of a nonvolatile memory device according to an embodiment of the inventive concepts.

FIG. 1 illustrates a block diagram of a nonvolatile memory device according to an embodiment of the inventive concepts. Referring to FIG. 1, a nonvolatile memory device 100 includes a bank array 110, an address buffer 120, a command buffer 130, a program (PGM) current generator 140, and a control logic circuit 150.

The bank array 110 may include first to k-th banks 111 to 11k (i.e., first, second, third to kth banks 111, 112, 113 to 11k as shown). Each of the first to k-th banks 111 to 11k may include memory cells for storing data. The first to k-th banks 111 to 11k may perform write operations or read operations independently of each other. The write operation may include a set operation of changing a logical value of "0" to a logical value of "1" and a reset operation of changing the logical value of "1" to the logical value of "0". The number of banks included in the bank array 110 is not limited.

The address buffer 120 may receive an address ADDR from an external device. The address buffer 120 may provide a bank address BA of the address ADDR to the control logic circuit 150. The address buffer 120 may provide a row address RA and a column address CA to the bank array 110. The address buffer 120 may provide the row address RA and the column address CA to a bank which the control logic circuit 150 selects based on the bank address BA. The address buffer 120 may operate at a timing which is determined under control of the control logic circuit 150.

The command buffer 130 may receive a command CMD from the external device. The command buffer 130 may provide the received command CMD to the control logic circuit 150. The command buffer 130 may operate at a timing which is determined under control of the control logic circuit 150.

The program current generator 140 may receive data signals DQ for a write operation from the external device. The program current generator 140 may generate a program current IPGM, based on the data signals DQ. The program current generator 140 may supply the program current IPGM to a bank selected from the first to k-th banks 111 to 11k. The program current generator 140 may generate different program currents IPGM for each bank or for each group of banks, the number of which is determined in advance, in consideration of physical locations of the first to k-th banks 111 to 11k. This will be more fully detailed later.

The control logic circuit 150 may control an operation of the nonvolatile memory device 100. The control logic circuit 150 may receive control information CTRL from the external device. The control logic circuit 150 may receive the bank address BA from the address buffer 120 and may receive the command CMD from the command buffer 130. The control logic circuit 150 may operate based on the control information CTRL, the bank address BA, and the command CMD. For example, the control logic circuit 150 may generate first, second, third and fourth control signals C1, C2, C3 and C4 for controlling timings at which the bank array 110, the address buffer 120, the command buffer 130, and the program current generator 140 operate respectively.

Figure 2:
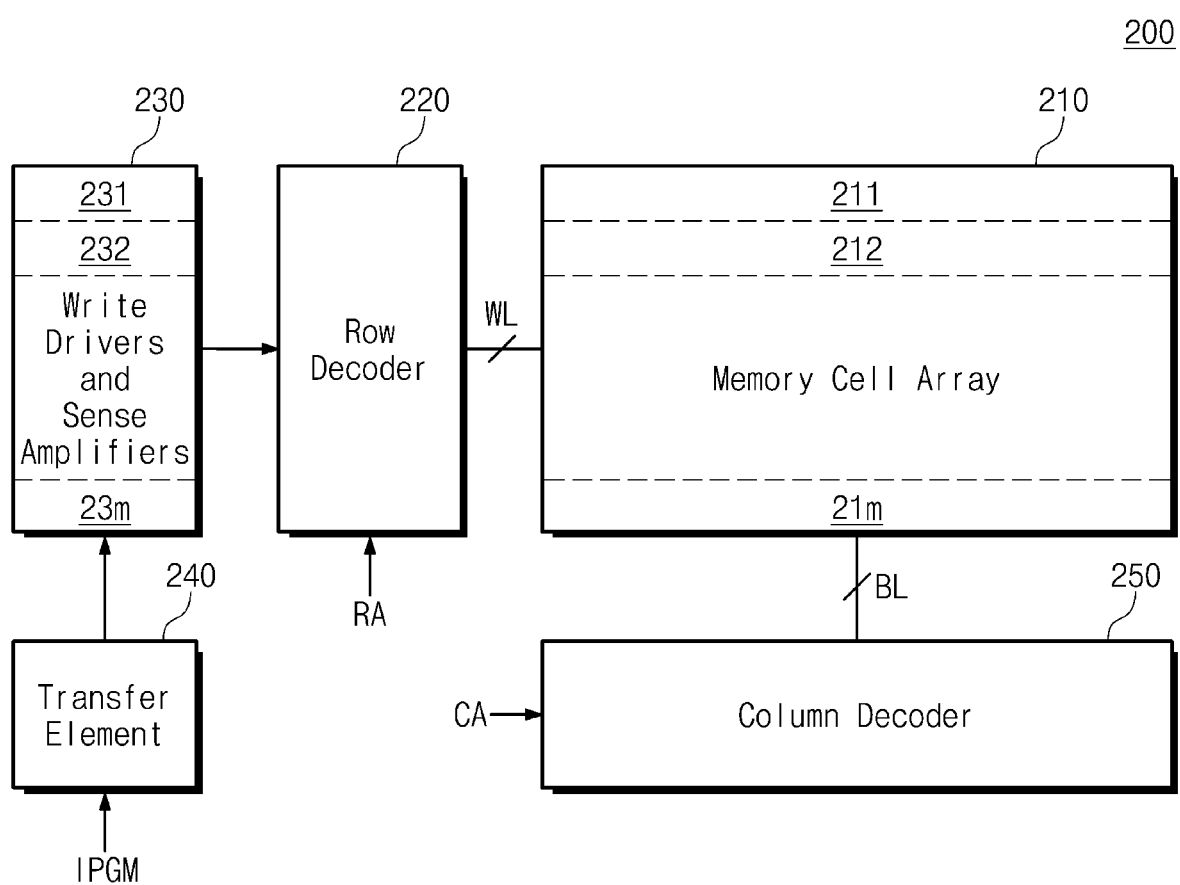
FIG. 2 illustrates a diagram of an exemplary embodiment of a bank of FIG. 1.

FIG. 2 illustrates a diagram of an exemplary embodiment of a bank of FIG. 1. A bank 200 of FIG. 2 may be one of the first to k-th banks 111 to 11k of FIG. 1. Referring to FIG. 2, the bank 200 includes a memory cell array 210, a row decoder 220, write drivers and sense amplifiers 230, a transfer element 240, and a column decoder 250.

The memory cell array 210 may include memory cells connected to word lines WL and bit lines BL. For example, memory cells in each row may be connected to one word line. Memory cells in each column may be connected to one bit line. The memory cell array 210 may include phase change memory cells.

The memory cell array 210 may be divided into first, second to m-th cell areas 211, 212 to 21m. Each of the first to m-th cell areas 211 to 21m may include memory cells corresponding to at least one word line. Here, "m" which indicates the number of divided areas may correspond to the number of write drivers. For example, one cell area and one write driver may be defined as one bay in the bank 200.

The row decoder 220 is connected to the memory cell array 210 through the word lines WL. The row decoder 220 may receive the row address RA from the address buffer 120 of FIG. 1. The row decoder 220 may select one of the word lines WL, based on the row address RA. The row decoder 220 may apply a selection voltage or a selection current to the selected word line, and may apply a non-selection voltage or a non-selection current to each of unselected word lines.

The write drivers and sense amplifiers 230 are connected to the memory cell array 210 through the word lines WL. The write drivers and sense amplifiers 230 may write data to selected memory cells connected to the selected bit line by applying the program current IPGM to the word line selected by the row decoder 220. For example, the write drivers and sense amplifiers 230 may perform the set operation or the reset operation on the selected memory cells to change resistance values of the selected memory cells, thus writing or erasing data.

The write drivers and sense amplifiers 230 may read data from the selected memory cells by sensing currents of the word lines WL. For example, the write drivers and sense amplifiers 230 may perform the read operation on the selected memory cells to determine ranges of resistance values of the selected memory cells, thus reading data.

During the write operation, write drivers may mirror (or copy) the program current IPGM provided to the transfer element 240 so as to be applied to the selected memory cells. The write drivers and sense amplifiers 230 may be divided into first, second to m-th driver areas 231, 232 to 23m. Each of the first to m-th driver areas 231 to 23m may include one write driver and one sense amplifier. The first to m-th driver areas 231 to 23m may be arranged in parallel. Locations of the write drivers respectively included in the first to m-th driver areas 231 to 23m may be different from each other, and a result of mirroring the program current IPGM may vary with a location of a write driver. The reason that a mirroring characteristic of a write driver varies with a location, and ways to overcome a difference between mirroring characteristics, will be described later.

The transfer element 240 may receive the program current IPGM from the program current generator 140 of FIG. 1. The transfer element 240 may provide the received program current IPGM to the write drivers and sense amplifiers 230. The transfer element 240 may include a transistor which may mirror the program current IPGM and may transfer the mirrored current to the write drivers. For example, to mirror the program current IPGM, a gate terminal of the transistor included in the transfer element 240 may be connected to gate terminals of transistors respectively included in the write drivers.

The column decoder 250 may receive the column address CA from the address buffer 120 of FIG. 1. The column decoder 250 may select at least one of the bit lines BL, based on the column address CA.

Figure 3:
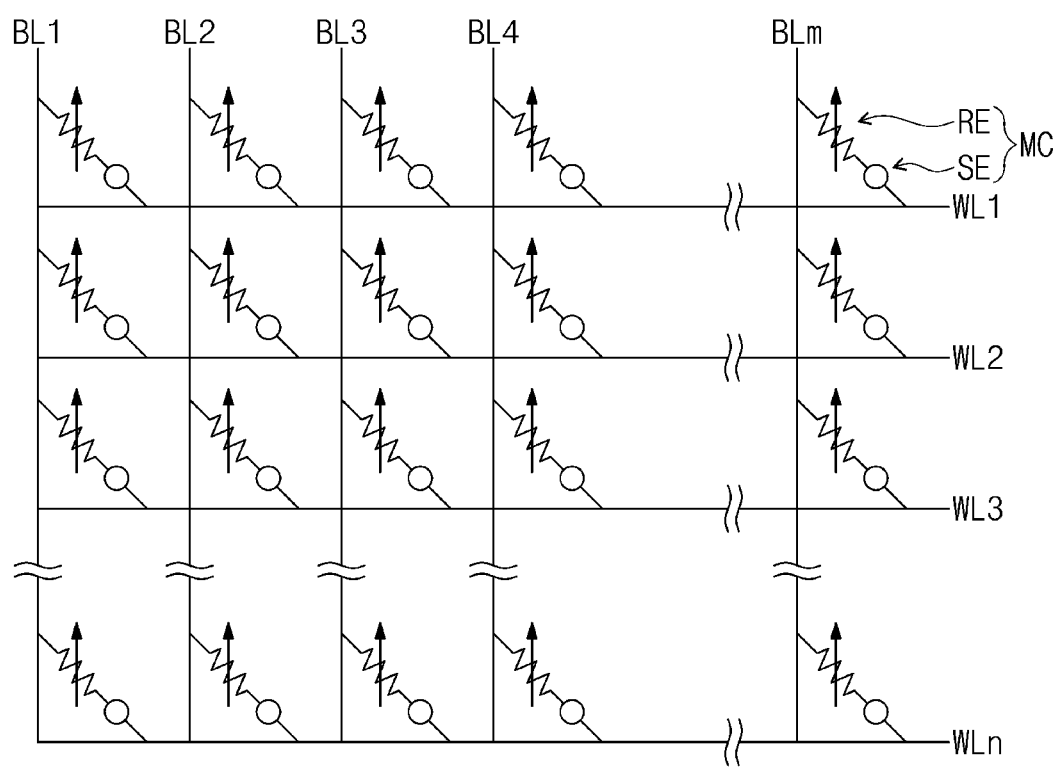
FIG. 3 illustrates an exemplary circuit diagram of a memory cell array of FIG. 2.

FIG. 3 illustrates an exemplary circuit diagram of a memory cell array of FIG. 2. Referring to FIG. 3, the memory cell array 210 includes memory cells MC. The memory cells MC may be arranged in rows and columns. The memory cells MC arranged in the rows may be connected to word lines WL1, WL2, WL3 to WLn. The memory cells MC arranged in the columns may be connected to first to m-th bit lines BL1, BL2, BL3, and BL4 to BLm.

Each of the memory cells MC are connected to one word line and one bit line. Each of the memory cells MC includes a selection element SE and a resistance element RE. The selection element SE may be controlled by a word line connected thereto, and may electrically connect the resistance element RE to a bit line corresponding to thereto. The selection element SE may for example include a transistor or ovonic threshold switch (OTS) which is controlled by a voltage of a word line.

The resistance element RE may have a resistance value which is changed by the set operation or the reset operation. The resistance element RE may be connected to the corresponding bit line. The resistance element RE may include a phase change material having a resistance value which is differently determined according to crystalline and amorphous states. The phase change material may vary with the program current IPGM.

In the set operation, a program current for the set operation may be applied to the resistance element RE in the form of a set pulse. When the set pulse is applied to the resistance element RE, the phase change material of the resistance element RE may have the crystalline state and may have a low resistance value (i.e., a logical value of "1"). In the reset operation, a program current for the reset operation may be applied to the resistance element RE in the form of a reset pulse. When the reset pulse is applied to the resistance element RE, the phase change material of the resistance element RE may have the amorphous state and may have a high resistance value (i.e., a logical value of "0"). The set pulse may be provided during a longer time than the reset pulse and may have a smaller current level than the reset pulse.

Figure 4:
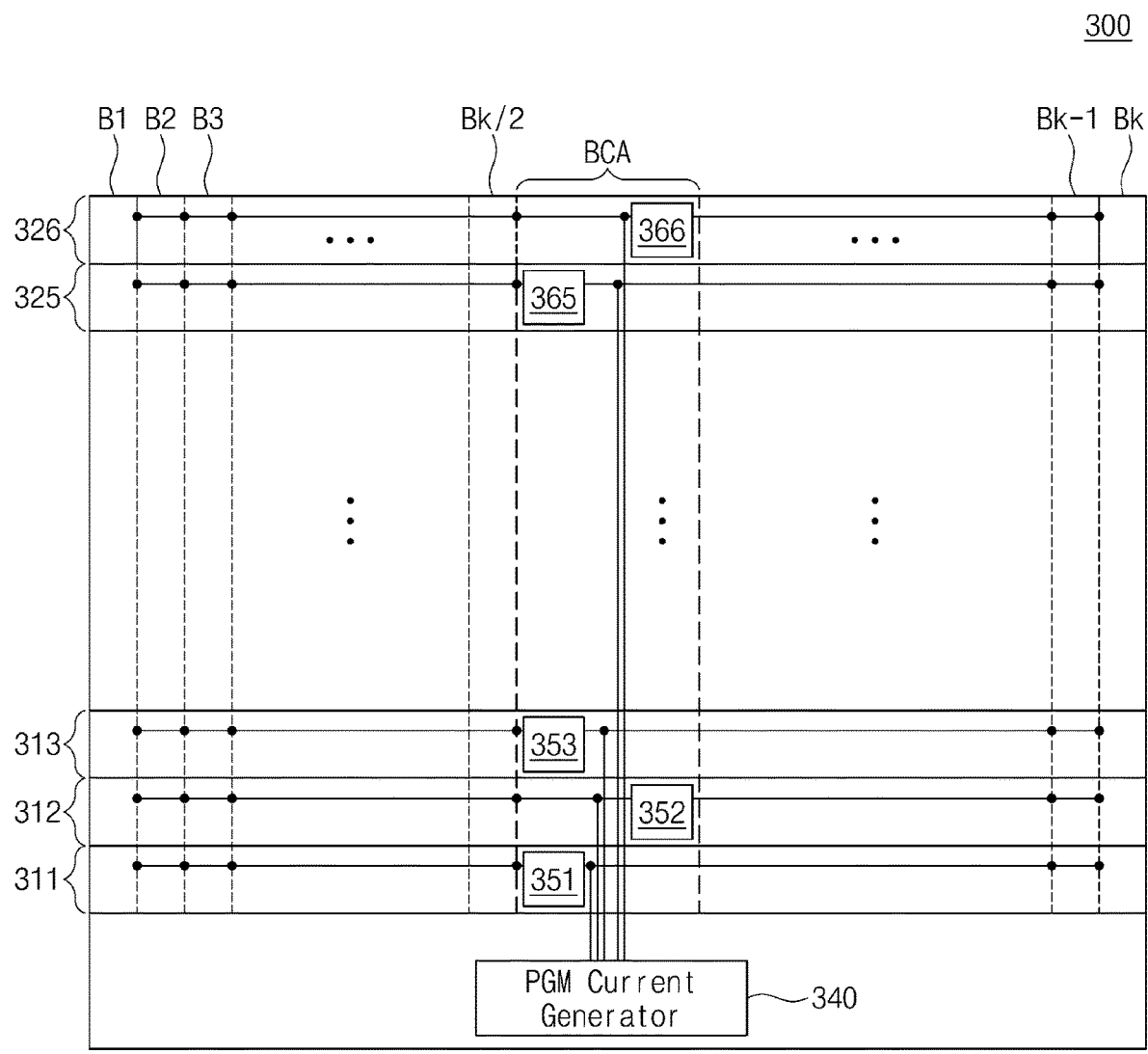
FIG. 4 illustrates a diagram of an exemplary architecture of a nonvolatile memory device described with reference to FIGS. 1 and 2.

FIG. 4 illustrates a diagram of an exemplary architecture of a nonvolatile memory device described in FIGS. 1 and 2. Referring to FIG. 4, a nonvolatile memory device 300 includes first to sixteenth banks 311 to 326 (i.e., first, second, third to fifteenth and sixteenth banks 311, 312, 313 to 325 and 326 as shown) and a program current generator 340. The first to sixteenth banks 311 to 326 and the program current generator 340 may be formed on a semiconductor substrate. The first to sixteenth banks 311 to 326 respectively correspond to the first to k-th banks 111 to 11k of FIG. 1, and the program current generator 340 corresponds to the program current generator 140 of FIG. 1.

In FIG. 4 and the following drawings, a first direction DR1 and a second direction DR2 are defined. The first direction DR1 is defined as a direction in which the first to sixteenth banks 311 to 326 are arranged. The second direction DR2 is defined as a direction which is perpendicular to or intersects the first direction DR1 and in which the first to sixteenth banks 311 to 326 extend. The number of banks included in the nonvolatile memory device 300 is not limited.

Each of the first to sixteenth banks 311 to 326 includes first to k-th bays B1 to Bk (i.e., first, second, third to k/2-th to (k−1)-th and k-th bays B1, B2, B3 to Bk/2 to Bk−1 and Bk). Each of the first to k-th bays B1 to Bk may include one write driver and memory cells corresponding to the write driver. The memory cells may be connected with the write driver through a word line. The first to sixteenth banks 311 to 326 may be respectively arranged in the first direction DR1.

The first to sixteenth banks 311 to 326 may further include first to sixteenth transfer elements 351 to 366, respectively. For example, the first bank 311 includes the first transfer element 351, the second bank 312 includes the second transfer element 352, the third bank 313 includes the third transfer element 353, the fifteenth bank 325 includes the fifteenth transfer element 365 and the sixteenth bank 326 includes the sixteenth transfer element 366. Each of the first to sixteenth transfer elements 351 to 366 receives a program current from the program current generator 340. The program currents which the first to sixteenth transfer elements 351 to 366 receive may be different from each other. That is, a first program current which the first transfer element 351 receives may be different from a second program current which the second transfer element 352 receives. To this end, the first to sixteenth transfer elements 351 to 366 may receive the program currents through different lines.

Since the first to sixteenth banks 311 to 326 include independent transfer elements, respectively, program currents optimized according to bank locations may be provided to write drivers. The optimized program current may be a current which may allow data to be stored without an error with regard to all program states upon performing the write operation on any selected memory cell included in a bank. Performance of the write driver may vary with a bank location.

The degree of deterioration due to a manufacturing process, electrical signals provided to a bank, and the use of a bank may vary with bank location. As a distance between banks increases, a characteristic difference of elements included in respective banks may increase, thereby causing an increase of a difference between the optimized program currents. Also, since one bank operates after being selected based on the bank address BA of FIG. 1, a characteristic difference between elements (e.g., write drivers) in the bank may be smaller than a difference between element characteristics of different banks. The characteristic difference may depend on a retention time, a temperature, the number of program/erase cycles, or a transfer path of a program current of each bank, or a variation degree of a supply voltage provided to a write driver.

The first to sixteenth transfer elements 351 to 366 are formed in a bank center area BCA. The bank center area BCA may include an area which is placed at the center of the first to sixteenth banks 311 to 326 with respect to the second direction DR2. For example, first to k/2-th bays B1 to Bk/2 (a first memory area) of a bank are formed on one side of the bank center area BCA, and (k/2+1)-th to k-th bays Bk/2+1 to Bk (a second memory area) of the bank are formed on an opposite side of the bank center area BCA. Each of the first memory area and the second memory area may include "k/2" bays. The bank center area BCA may be defined between the first memory area and the second memory area.

Since the first to sixteenth transfer elements 351 to 366 are formed in the bank center area BCA, a program current may be provided to a write driver included in each of the first to k-th bays B1 to Bk through an optimized transfer path. Write drivers connected to one of the first to sixteenth transfer elements 351 to 366 may mirror a program current so as to be supplied to selected memory cells. A distance between a transfer element formed in the bank center area BCA and a write driver may decrease, and thus, a current mirroring characteristic may be improved. That is, accuracy and reliability of the write operation may be improved, and an error may decrease with regard to the write operation.

The program current generator 340 may be provided on a periphery of the nonvolatile memory device 300. The program current generator 340 may generate first to sixteenth program currents respectively optimized with respect to the first to sixteenth banks 311 to 326. The first to sixteenth program currents may be supplied to the first to sixteenth transfer elements 351 to 366 through different paths, respectively. The program current generator 340 may be positioned adjacent to the bank center area BCA.

Although not illustrated in FIG. 4, the nonvolatile memory device 300 may further include the address buffer 120, the command buffer 130, and the control logic circuit 150 of FIG. 1. For example, the address buffer 120, the command buffer 130, and the control logic circuit 150 may be positioned in a peripheral area (or a peripheral circuit). Although not illustrated in FIG. 4, each of the first to sixteenth banks 311 to 326 may further include the row decoder 220 and the column decoder 250 of FIG. 2. For example, the row decoder 220 may be positioned in the bank center area BCA. For example, the column decoder 250 may be positioned adjacent to the first to k-th bays B1 to Bk in the first direction DR1 or may be positioned in the bank center area BCA.

Figure 5:
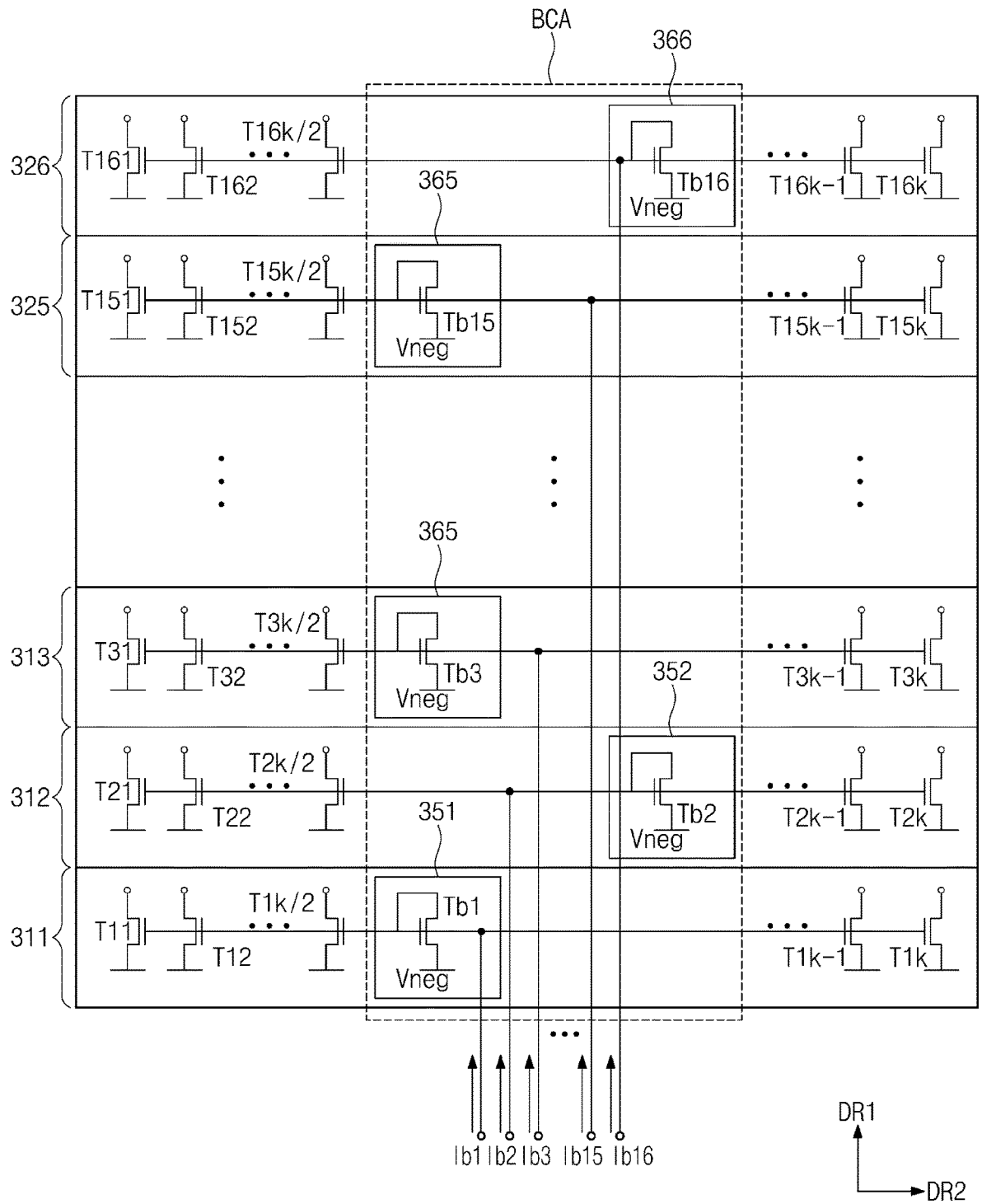
FIG. 5 illustrates a diagram of a bank array of FIG. 4.

FIG. 5 illustrates a diagram of a bank array of FIG. 4. Referring to FIG. 5, a bank array 310 includes the first to sixteenth banks 311 to 326. The first to sixteenth banks 311 to 326 correspond to the first to sixteenth banks 311 to 326 of FIG. 4. For convenience's sake, FIG. 5 will be described with reference to the reference numerals/marks of FIG. 4.

The first to sixteenth banks 311 to 326 may include the first to sixteenth transfer elements 351 to 366, respectively. The first to sixteenth transfer elements 351 to 366 correspond to the first to sixteenth transfer elements 351 to 366 of FIG. 4. Each of the first to sixteenth transfer elements 351 to 366 receives the corresponding program current of first to sixteenth program currents Ib1 to Ib16 (i.e., program currents Ib1, Ib2, Ib3 to Ib15, and Ib16 as shown). The first to sixteenth transfer elements 351 to 366 may be formed in the bank center area BCA described with reference to FIG. 4

The first to sixteenth transfer elements 351 to 366 respectively include first to sixteenth mirror source transistors Tb1 to Tb16 (i.e., mirror source transistors Tb1, Tb2, Tb3 to Tb15, and Tb16 as shown), each of which transfers a received program current to a selected memory cell through mirroring. Each of the first to sixteenth mirror source transistors Tb1 to Tb16 includes a first terminal connected to receive the corresponding program current of the first to sixteenth program currents Ib1 to Ib16, a second terminal connected to receive a supply voltage Vneg, and a gate terminal connected to the first terminal.

Each of the first to sixteenth banks 311 to 326 includes a mirror source transistor and a mirrored transistor. For example, the first bank 311 may include the first mirror source transistor Tb1 and first to k-th mirrored transistors T11 to T1k (i.e., mirrored transistors T11, T12 to T1k/2 to T1k-1, and T1k as shown). Here, "k" may correspond to the number of bays or write drivers for each bank. One mirrored transistor may be included in one write driver.

Each of the first to k-th mirrored transistors T11 to T1k, . . . , T161 to T16k includes a first terminal to transfer a mirrored program current to a memory cell, a second terminal to receive a supply voltage in a write operation, and a gate terminal connected with the gate terminal of the corresponding mirror source transistor of the first to sixteenth mirror source transistors Tb1 to Tb16. The mirror source transistor and the mirrored transistor may form a current mirror structure together. Mirrored transistors (e.g., T11 to T1k, . . . , or T161 to T16k) included in one bank may be connected in parallel with each other so as to perform a write operation on a selected bay. Since the first to sixteenth mirror source transistors Tb1 to Tb16 are provided in the bank center area BCA, each of the first to sixteenth mirror source transistors Tb1 to Tb16 may be positioned adjacent to a mirror source transistor. Accordingly, a noise may decrease in the process of transferring a program current for the purpose of mirroring the program current.

In detail, a mirrored program current may depend on transistor characteristics, such as a channel width, a channel length, and a threshold voltage of each of the mirrored transistor and the mirror source transistor. As such, when the mirror source transistor and the mirrored transistor have the same characteristic, a program current may be exactly mirrored. Since a bank-based operation is performed, a characteristic variation of the mirrored transistor may have a given correlation with regard to a bank. Since the mirror source transistor is provided for each bank, an optimized program current may be transferred for each bank, and thus, an error may decrease with regard to the write operation.

Also, when the supply voltage Vneg provided to the mirror source transistor is identical to the supply voltage provided to the mirrored transistor, a program current may be exactly mirrored. As a distance between the mirrored transistor and the mirror source transistor increases, a variation of a supply voltage may increase. Since the mirror source transistor is provided in the bank center area BCA, a difference between the supply voltage Vneg provided to the mirror source transistor and the supply voltage provided to the mirrored transistor may be minimized.

FIG. 5 shows a mirrored transistor and a mirror source transistor arranged as a simple current mirror circuit, but the inventive concept is not limited thereto. For example, various circuit structures for current mirroring may be provided. For example, a transistor may be connected in series to each of the mirror source transistor and the mirrored transistor such that a current mirror circuit of a cascade structure is formed. For example, a resistance element may be connected in series to each of the mirror source transistor and the mirrored transistor such that a current mirror circuit for source degeneration is formed.

Figure 6:
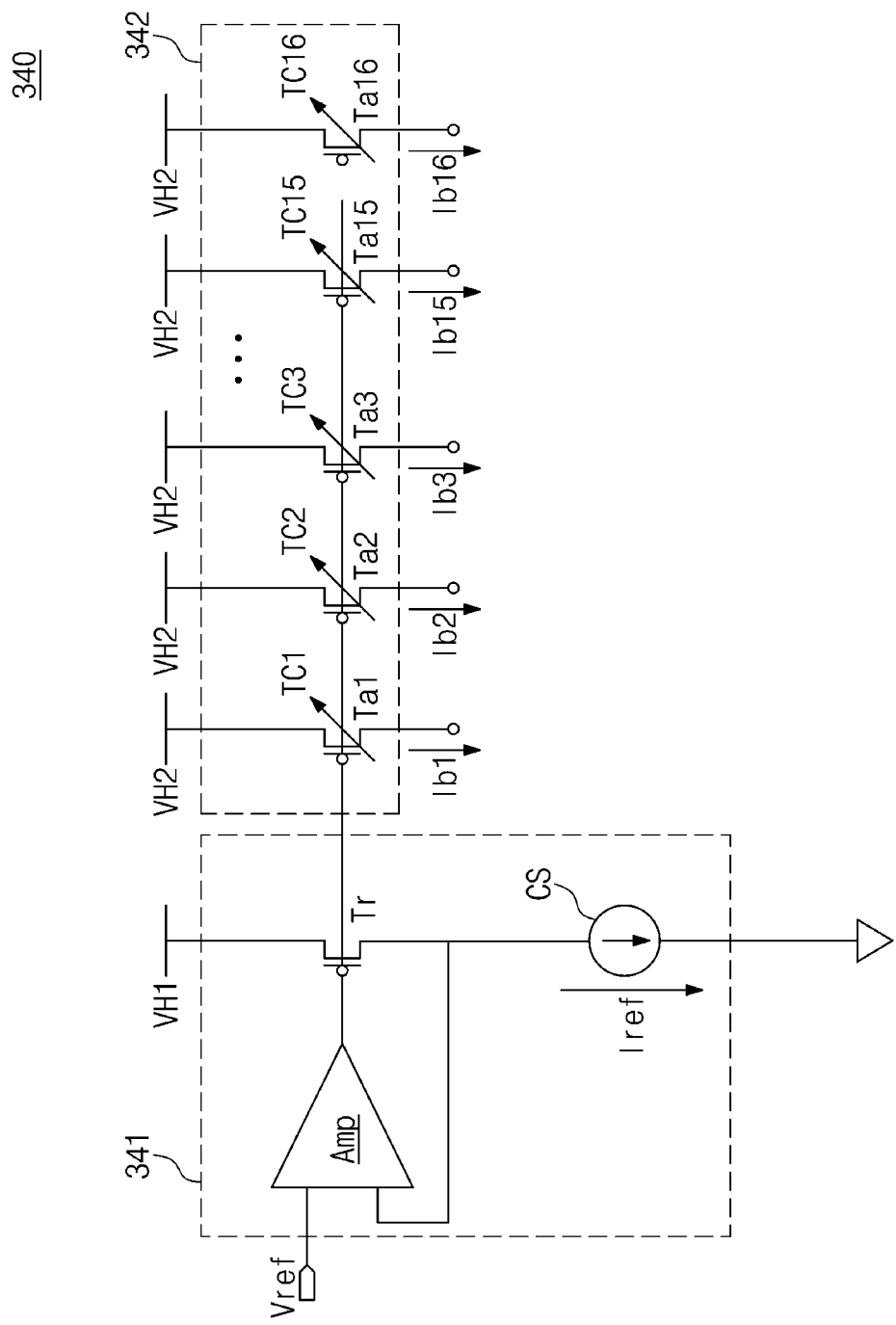
FIG. 6 illustrates a circuit diagram of a program current generator of FIG. 4.

FIG. 6 illustrates a circuit diagram of a program current generator of FIG. 4. Referring to FIG. 6, the program current generator 340 includes a reference current generator 341 and a current adjuster 342. The circuit diagram of FIG. 6 may be understood as an exemplary circuit for providing various program currents, and a circuit of the program current generator 340 of FIG. 4 is not limited to FIG. 6.

The reference current generator 341 generates a reference current Iref. To this end, the reference current generator 341 may include an amplifier Amp, a reference transistor Tr, and a current source CS. The amplifier Amp includes a first input terminal that receives a reference voltage Vref, a second input terminal that receives a feedback voltage, and an output terminal that outputs a gate voltage based on a difference between the reference voltage Vref and the feedback voltage.

The reference transistor Tr is configured to transfer the reference current Iref to the current adjuster 342 through current mirroring. The reference transistor Tr includes a first terminal that receives a first voltage VH1, a second terminal connected with the second input terminal of the amplifier Amp and that transfers the feedback voltage, and a gate terminal that receives the gate voltage. The reference current Iref may flow between the first terminal and the second terminal of the reference transistor Tr based on the gate voltage, and the feedback voltage may be determined.

The current source CS may output the reference current Iref. When a channel of the reference transistor Tr is established based on the gate voltage, the reference current Iref may flow through the reference transistor Tr, and the reference current Iref may be transferred to the current adjuster 342 through the current mirroring. The current source CS includes a first terminal connected to the second terminal of the reference transistor Tr and the second input terminal of the amplifier Amp, and a second terminal connected to ground.

The current adjuster 342 includes first to sixteenth current adjusting transistors Ta1 to Ta16 (i.e., current adjusting transistors Ta1, Ta2, Ta3 to Ta15, and Ta16 as shown). The number of current adjusting transistors may be identical to the number (16) of transfer elements of FIG. 4 or 5. In the embodiment of FIGS. 4 and 5, the number of current adjusting transistors may correspond to the number of banks. The first to sixteenth current adjusting transistors Ta1 to Ta16 may mirror the reference current Iref. Each of the first to sixteenth current adjusting transistors Ta1 to Ta16 include a first terminal that receive a second voltage VH2, a second terminal that outputs the corresponding program current of the first to sixteenth program currents Ib1 to Ib16 to the bank array 310 of FIG. 5, and a gate terminal connected to the gate terminal of the reference transistor Tr. For example, the second voltage VH2 may be the same as the first voltage VH1 to provide the current mirroring.

The first to sixteenth current adjusting transistors Ta1 to Ta16 may adjust the mirrored reference current Iref to generate the first to sixteenth program currents Ib1 to Ib16. The first to sixteenth program currents Ib1 to Ib16 may be respectively adjusted based on first to sixteenth codes TC1 to TC16 (i.e., codes TC1, TC2, TC3 to TC15, and TC16). The first to sixteenth codes TC1 to TC16 are respectively provided to the first to sixteenth current adjusting transistors Ta1 to Ta16. The first to sixteenth codes TC1 to TC16 may be provided from an external device, and may be included in the data signals DQ of FIG. 1.

Each of the first to sixteenth current adjusting transistors Ta1 to Ta16 may be a variable transistor. For example, each of the first to sixteenth current adjusting transistors Ta1 to Ta16 may include a reference mirrored transistor connected with the gate terminal of the reference transistor Tr so as to mirror the reference current Iref, and a variable element connected in series with the reference mirrored transistor that adjusts a level of a mirrored current based on a code. For example, the variable element may be a variable resistor, a resistance value of which varies with a code. For example, the variable element may be a transistor which includes a gate terminal to receive a code and is connected in series with the reference mirrored transistor.

Each of the first to sixteenth codes TC1 to TC16 may be generated based on data to be written to the corresponding bank. For example, each of the first to sixteenth codes TC1 to TC16 may be generated based on binary data to be written. For example, each of the first to sixteenth codes TC1 to TC16 may have a voltage level which depends on a magnitude of a data value to be written. Levels of the first to sixteenth program currents Ib1 to Ib16 may be adjusted based on the voltage levels of the first to sixteenth codes TC1 to TC16.

Each of the first to sixteenth codes TC1 to TC16 may be generated in consideration of a characteristic change according to a location of the corresponding bank. For example, even though the same data value may be intended to be written to each bank, the first to sixteenth codes TC1 to TC16 may have different levels, considering a variation of the supply voltage Vneg for each bank. For example, in the case where a distribution range of a program current of the first bank 311 is formed to be higher than a distribution range of a program current of the second bank 312, the first program current Ib1 generated based on the first code TC1 may have a higher level than the second program current Ib2 generated based on the second code TC2.

Figure 7:
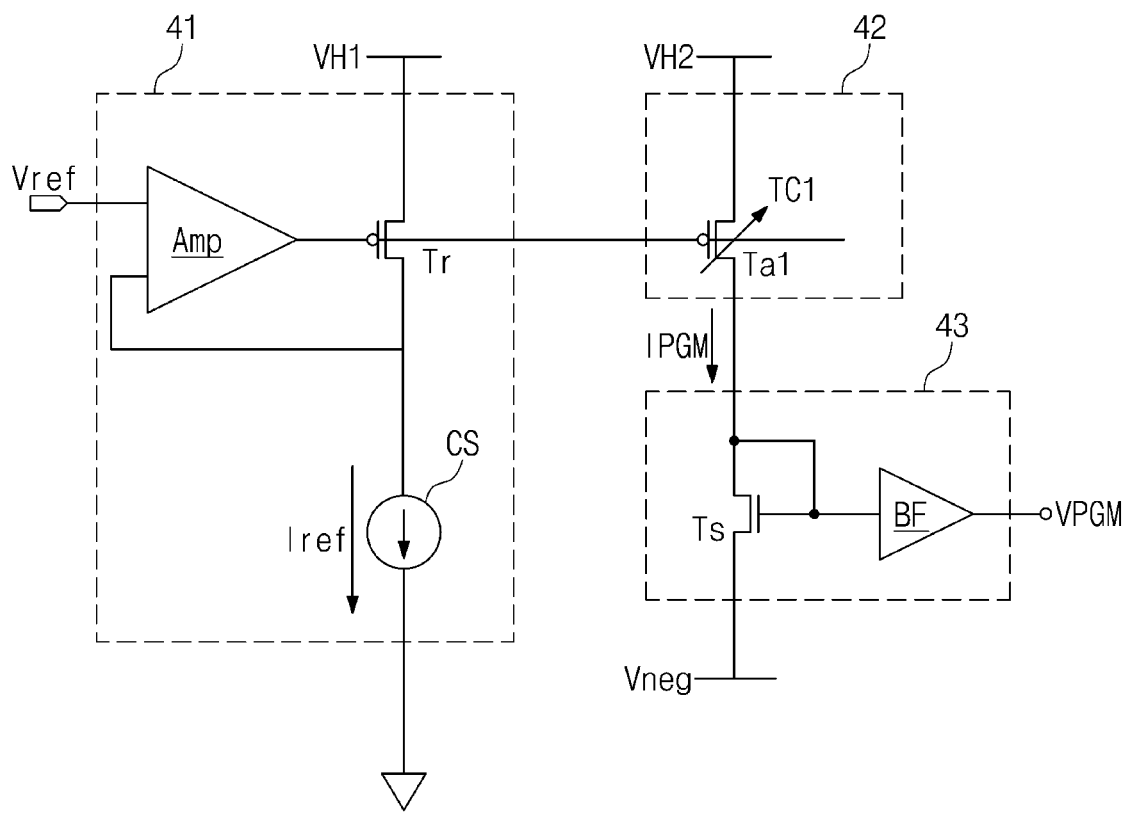
FIG. 7 illustrates a circuit diagram of a program current generator including a transfer element.

FIG. 7 illustrates a circuit diagram of a program current generator including a transfer element. Referring to FIG. 7, a program current generator 40 includes a reference current generator 41, a current adjuster 42, and a transfer circuit 43. The reference current generator 41 includes the amplifier Amp, the reference transistor Tr, and the current source CS for the purpose of generating the reference current Iref. A structure of the reference current generator 41 may be identical to the structure of the reference current generator 341 of FIG. 6.

The current adjuster 42 may mirror the reference current Iref to generate the program current IPGM. To this end, the current adjuster 42 may include one current adjusting transistor Ta1. Unlike FIG. 6, in the case where separate transfer elements are not positioned in the bank array 310 such as in FIG. 7, the current adjuster 42 in FIG. 7 may generate one program current IPGM. The current adjusting transistor Ta1 may adjust the mirrored reference current Iref based on a code TC1. The program current IPGM is provided to the transfer circuit 43.

The transfer circuit 43 may transfer the program current IPGM to a write driver of a selected bank through current mirroring. To this end, the transfer circuit 43 may include a mirror source transistor Ts and a buffer BF. The mirror source transistor Ts corresponds to the mirror source transistor of FIG. 5. The mirror source transistor Ts includes a first terminal that receives the program current IPGM, a second terminal that receives the supply voltage Vneg, and a gate terminal connected with the first terminal.

The buffer BF is connected between the gate terminal of the mirror source transistor Ts and the gate terminal of the mirrored transistor of FIG. 5. The buffer BF may temporarily store a program voltage VPGM generated based on the program current IPGM flowing through the mirror source transistor Ts and may output the program voltage VPGM to the mirrored transistor.

In the case of performing a write operation on a plurality of banks by using one program current IPGM generated by the program current generator 40 described with respect to FIG. 7, a loading time or a noise recovery time increases. Accordingly, the buffer BF for performing the write operation is required. In other words, in the nonvolatile memory device 300 according to an embodiment of FIGS. 4 to 6, since a transfer element for current mirroring is positioned in a bank center area for each bank, the separate buffer BF may not be required.

Also, in the case of performing a write operation on a plurality of banks by using one program current IPGM generated by the program current generator 40 described with respect to FIG. 7, since the write operation is performed on the whole bank array through one program current, it is difficult to cope with a characteristic change according to a bank location. An optimized program current may vary with a bank location. Accordingly, in the case of performing the write operation based on one program current IPGM, an error may occur at a specific bank. For example, a data value to be written and a stored data value may be different, or data may not be stored to a memory cell targeted for a write operation.

Figure 8:
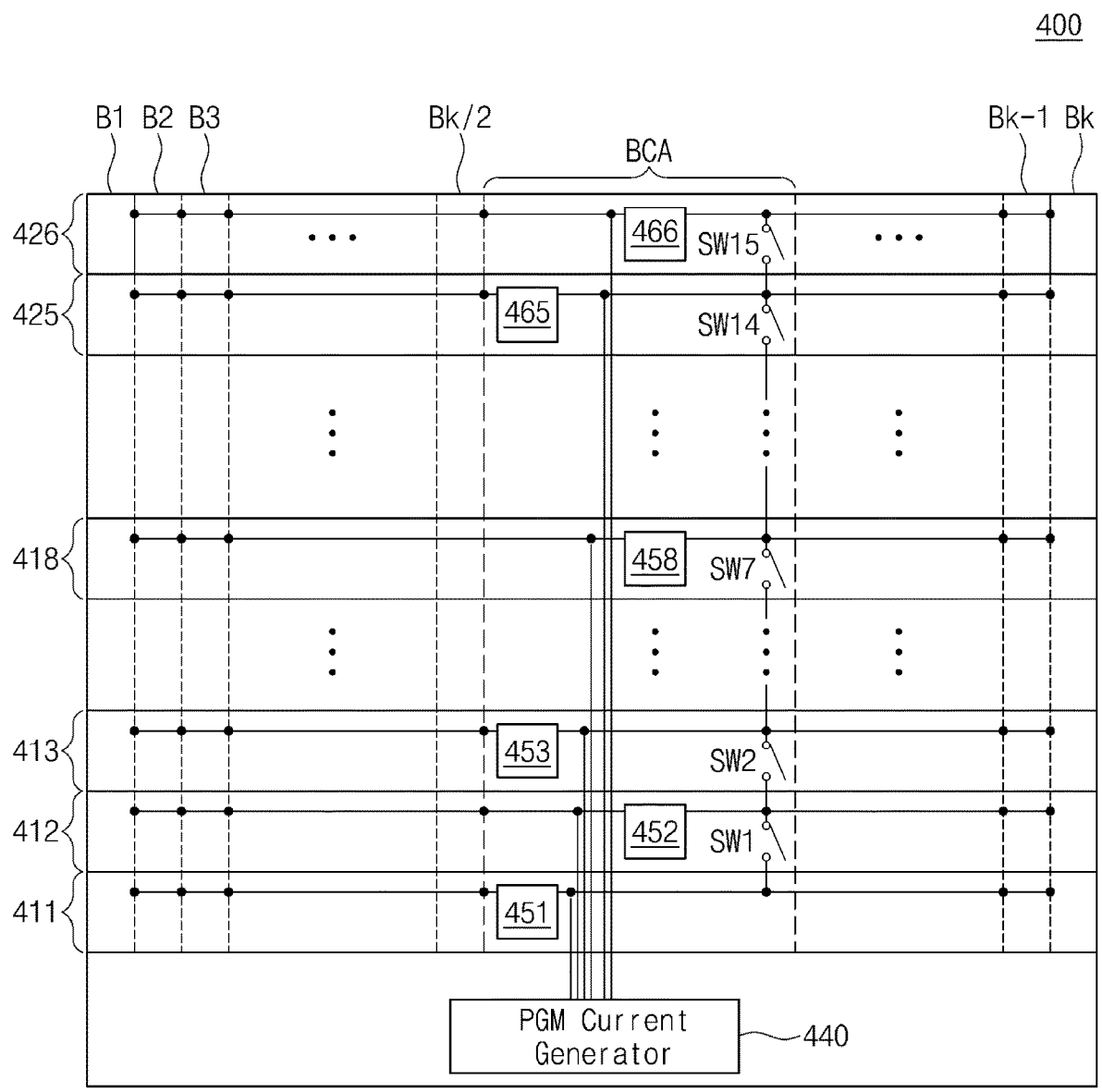
FIG. 8 illustrates a diagram of an exemplary architecture of a nonvolatile memory device described in FIGS. 1 and 2.

FIG. 8 illustrates a diagram of an exemplary architecture of a nonvolatile memory device described in FIGS. 1 and 2. Referring to FIG. 8, a nonvolatile memory device 400 includes first to sixteenth banks 411 to 426 and a program current generator 440. Each of the first to sixteenth banks 411 to 426 includes first to k-th bays B1 to Bk, in each of which one write driver (a mirrored transistor) is provided. First to sixteenth transfer elements 451 to 466 are formed in the bank center area BCA, and correspond to the first to sixteenth banks 411 to 426.

The nonvolatile memory device 400 includes first to fifteenth switches SW1 to SW15 (i.e., switches SW1, SW2 to SW7 to SW14, and SW15 as shown). The first to fifteenth switches SW1 to SW15 are positioned in the bank center area BCA. Each of the first to fifteenth switches SW1 to SW15 are connected between (or to) two adjacent transfer elements among the first to sixteenth transfer elements 451 to 466. For example, the first switch SW1 is connected between (or to) the first transfer element 451 and the second transfer element 452, and the fifteenth switch SW15 is connected between (or to) the fifteenth transfer element 465 and the sixteenth transfer element 466. Each of the first to fifteenth switches SW1 to SW15 may be connected to a gate terminal of a mirror source transistor included in each of two adjacent transfer elements (and a first terminal of the mirror source transistor connected to the gate terminal (see FIG. 5 for example)).

In a standby mode, the first to fifteenth switches SW1 to SW15 are turned on. For example, the first to fifteenth switches SW1 to SW15 may be turned on by a switching signal received from the control logic circuit 150 of FIG. 1. The standby mode may be defined as an operation mode before or after storing data for the purpose of performing the write operation. In the standby mode, the program current generator 440 may generate a standby current by using a current adjusting transistor corresponding to one transfer element. For example, the current adjusting transistor to generate the standby current may correspond to the eighth transfer element 458 included in a bank (e.g., the eighth bank 418) which is centered with respect to the first direction DR1. The standby current may be provided to the first to sixteenth transfer elements 451 to 466 through the first to fifteenth switches SW1 to SW15 which have been turned on. The standby current may thus be provided to the first to sixteenth banks 411 to 426 through the first to fifteenth switches SW1 to SW15 which have been turned on.

In an active mode, the first to fifteenth switches SW1 to SW15 are turned off. For example, the first to fifteenth switches SW1 to SW15 may be turned off by a switching signal received from the control logic circuit 150 of FIG. 1. The active mode may be defined as an operation mode in which the write operation is performed. In the active mode, the program current generator 440 may generate first to sixteenth program currents by using first to sixteenth current adjusting transistors. In the case where the first to fifteenth switches SW1 to SW15 are turned off, the nonvolatile memory device 400 may have substantially the same circuit structure as the nonvolatile memory device 300 of FIG. 4. The first to sixteenth program currents may be respectively provided to the first to sixteenth banks 411 to 426.

Since the nonvolatile memory device 300 of FIG. 4 reduces an error in the write operation, and transfers a program current and a standby current through 16 lines, power consumption may increase in the standby mode. On the other hand, since the standby current is generated in the standby mode by using a current adjusting transistor and the first to fifteenth switches SW1 to SW15 in the nonvolatile memory device 400 of FIG. 8, power consumption of the nonvolatile memory device 400 may decrease. Also, since the standby current is provided to all the first to sixteenth banks 411 to 426, a wake-up time taken to change to the active mode does not increase.

Figure 9:
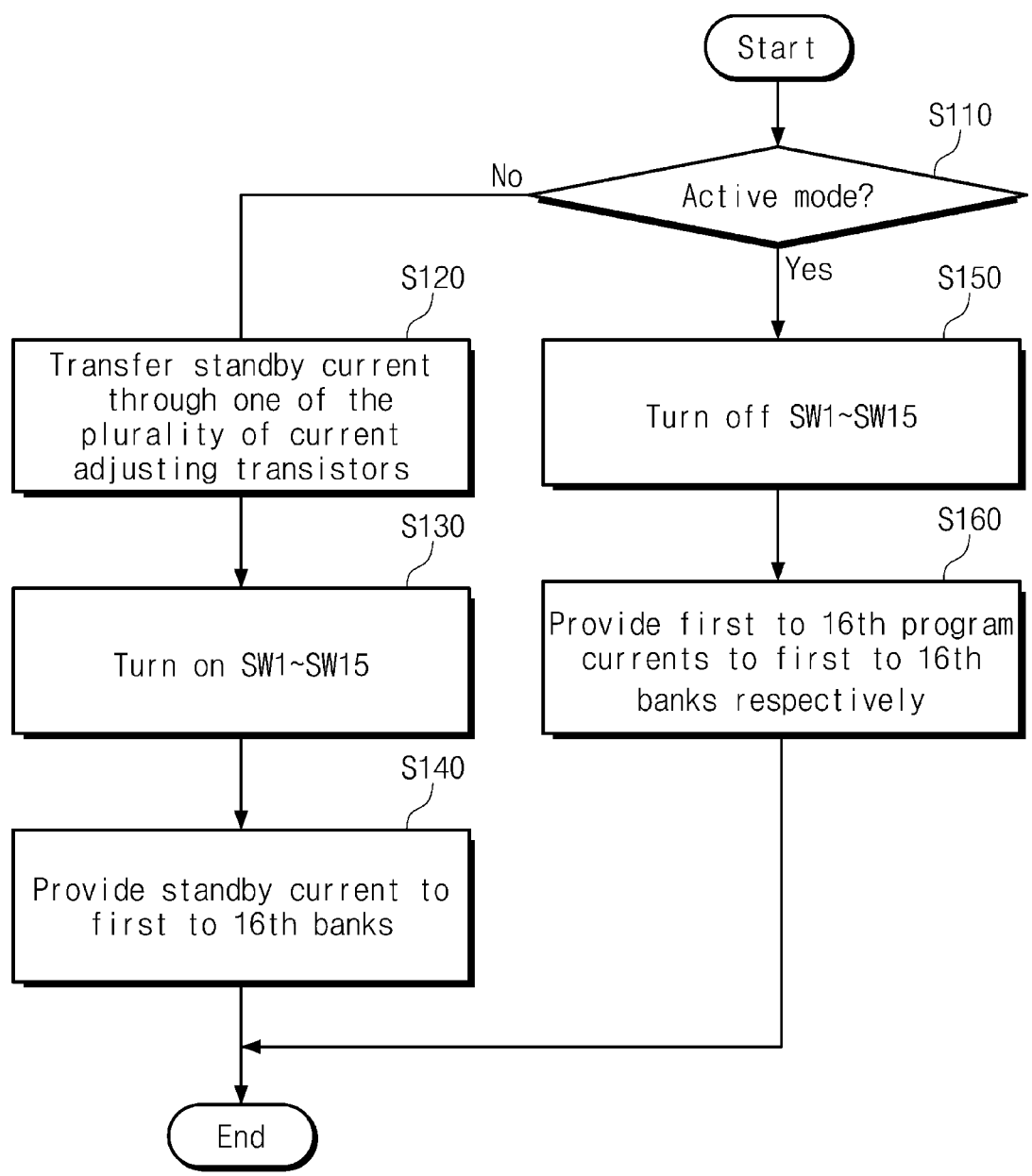
FIG. 9 illustrates a flowchart of an operation method of a nonvolatile memory system of FIG. 8.

FIG. 9 illustrates a flowchart of an operation method of a nonvolatile memory system of FIG. 8. Referring to FIG. 9, an operation method of a nonvolatile memory device may be performed in the nonvolatile memory device 400 described with reference to FIG. 8. For convenience of description, the flowchart of FIG. 9 will be described with reference to the reference numerals/marks of FIG. 8.

In operation S110, whether the nonvolatile memory device 400 operates in the active mode is determined. For example, this determination may be made by the control logic circuit 150 of FIG. 1. In the case where it is determined that the nonvolatile memory device 400 operates in the active mode (Yes in S110), for example in the case where a write operation is performed, operation S150 and operation S160 are performed. In the case where it is determined that the nonvolatile memory device 400 does not operate in the active mode (No in S110), for example in the case where it is determined that the nonvolatile memory device 400 operates in the standby mode, operation S120 to S140 are performed.

In operation S120, the nonvolatile memory device 400 operates in the standby mode. The program current generator 440 outputs the standby current using one of the current adjusting transistors. For example, a current adjusting transistor corresponding to the eighth transfer element 458 may be turned on, and remaining current adjusting transistors may be turned off. The standby current may be provided to the eighth transfer element 458 through the current adjusting transistor turned on.

In operation S130, the first to fifteenth switches SW1 to SW15 are tuned on. For example, the first to fifteenth switches SW1 to SW15 may be turned on by a switching signal received from the control logic circuit 150 of FIG. 1. Alternatively, the nonvolatile memory device 400 may receive the switching signal from an external device.

In operation S140, the standby current may be provided through the first to sixteenth transfer elements 451 to 466 to the first to sixteenth banks 411 to 426. The standby current may be provided to the first to sixteenth banks 411 to 426 by one current adjusting transistor outputting the standby current. The standby current may be provided to the first to sixteenth banks 411 to 426 through the first to fifteenth switches SW1 to SW15 that have been turned on. In the case of being in the standby mode, unlike as shown in FIG. 9, after operation S140 is performed, the process returns to operation S110 where determination is made as to whether the nonvolatile memory device 400 operates in the active mode.

In operation S150, the nonvolatile memory device 400 operates in the activate mode. The first to fifteenth switches SW1 to SW15 are tuned off. For example, the first to fifteenth switches SW1 to SW15 may be turned off by a switching signal received from the control logic circuit 150 of FIG. 1. Alternatively, the nonvolatile memory device 400 may receive the switching signal from an external device.

In operation S160, the first to sixteenth program currents are provided to the first to sixteenth banks 411 to 426, respectively. The program current generator 440 may generate the first to sixteenth program currents by the first to sixteenth current adjusting transistors (see FIG. 6). The first to sixteenth program currents may be respectively provided to the first to sixteenth transfer elements 451 to 466 through 16 lines arranged in parallel. In the case of being in the active mode, unlike as shown in FIG. 9, after operation S160 is performed, the process returns to operation S110 where determination is made as to whether the nonvolatile memory device 400 operates in the active mode.

Figure 10:
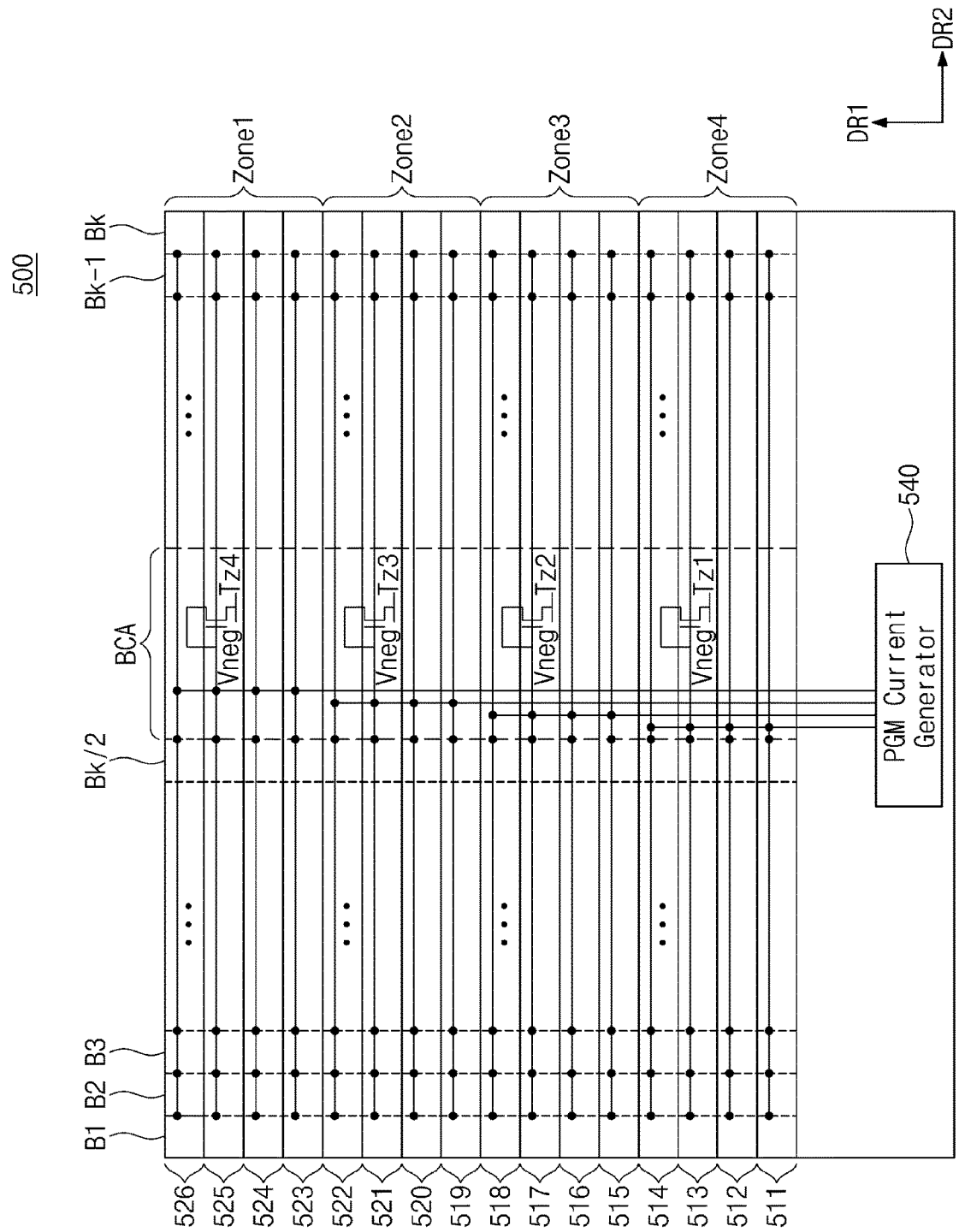
FIG. 10 illustrates a diagram of an exemplary architecture of a nonvolatile memory device described in FIGS. 1 and 2.

FIG. 10 illustrates a diagram of an exemplary architecture of a nonvolatile memory device described in FIGS. 1 and 2. Referring to FIG. 10, a nonvolatile memory device 500 includes first to sixteenth banks 511 to 526 and a program current generator 540. Each of the first to sixteenth banks 511 to 526 includes first to k-th bays B1 to Bk, in each of which one write driver (a mirrored transistor) is provided.

The nonvolatile memory device 500 includes first to fourth mirror source transistors Tz1, Tz2, Tz3 and Tz4 (first to fourth transfer elements) in the bank center area BCA. Unlike the nonvolatile memory device 300 of FIG. 4, the number of transfer elements or mirror source transistors does not correspond to the number of banks. For example, in the case of the nonvolatile memory device 500 of FIG. 10, one mirror source transistor is positioned for each group of four banks. For example, first mirror source transistor Tz1 is connected to banks 511, 512, 513 and 514, and fourth mirror source transistor Tz4 is connected to banks 523, 524, 525 and 526. Four banks are defined as one zone and share one mirror source transistor. The 16 banks are divided into first to fourth zones Zone1 to Zone4 each including four banks. It should be understood that each of the first to fourth mirror source transistors Tz1 to Tz4 is included in one of four banks.

Each of the first to fourth mirror source transistors Tz1 to Tz4 may transfer the corresponding program current of first to fourth program currents to a memory cell selected from four banks. Each of the first to fourth mirror source transistors Tz1 to Tz4 includes a first terminal to receive the corresponding program current of the first to fourth program currents, a second terminal to receive the supply voltage Vneg, and a gate terminal connected to the first terminal. The gate terminal may be connected to gate terminals of mirrored transistors included in four banks, and may be configured to allow the four banks to mirror a program current.

The width of the bank center area BCA may depend on the number of transfer elements or mirror source transistors and the number of lines for transferring a program current. As the number of transfer elements or mirror source transistors increases, the width of the bank center area BCA increases. Since one mirror source transistor is used in common for plural banks in FIG. 10, the width of the bank center area BCA may decrease. As a result, the width of the nonvolatile memory device 500 decreases.

Also, adjacent banks may have similar program current distribution ranges. As a distance between banks becomes closer, characteristic differences according to a variation of a process or the supply voltage Vneg may be similar. Accordingly, even though adjacent banks share a mirror source transistor, an error may decrease in a write operation, compared to the case where one mirror source transistor is used to program all the banks.

The program current generator 540 may generate the first to fourth program currents based on a reference current. The program current generator 540 may generate the first to fourth program currents by using four current adjusting transistors. In this case, four codes may be used to generate the first to fourth program currents. Accordingly, the number of transistors included in the program current generator 540 may decrease. Also, since the number of lines for transferring program currents decreases, the width of the bank center area BCA may decrease.

Although not illustrated in FIG. 10, the nonvolatile memory device 500 may further include switches for the purpose of operating in consideration of the standby mode and the activate mode, similar to the nonvolatile memory device 400 of FIG. 8. Also, as described with reference to FIG. 5, transfer elements of the nonvolatile memory device 500 may be implemented with a current mirror circuit of a cascade structure or a source degeneration structure.

Figure 11:
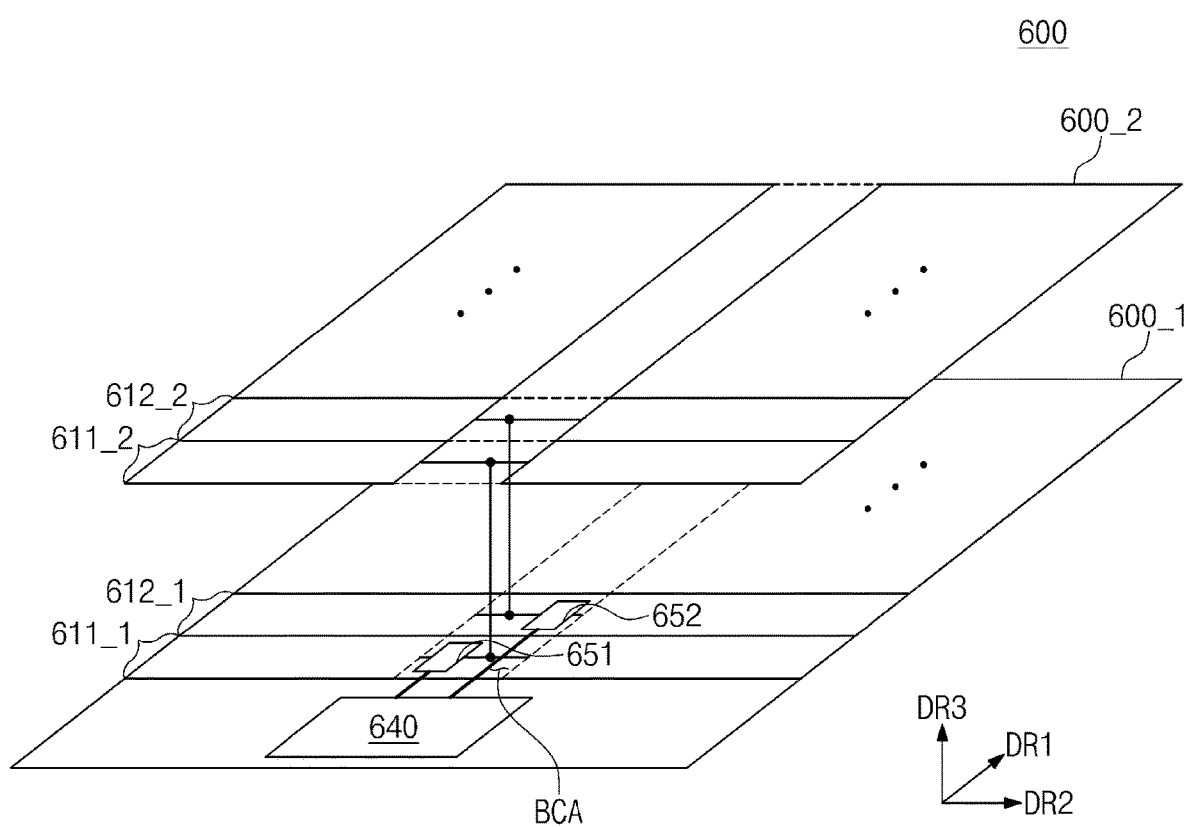
FIG. 11 illustrates a diagram of an exemplary architecture of a nonvolatile memory device according to an embodiment of the inventive concepts.

FIG. 11 illustrates a diagram of an exemplary architecture of a nonvolatile memory device according to an embodiment of the inventive concepts. Referring to FIG. 11, a nonvolatile memory device 600 includes a first floor 600_1, a second floor 600_2, a program current generator 640, and a plurality of transfer elements 651 and 652. The second floor 600_2 may be positioned adjacent to the first floor 600_1 in a third direction DR3 perpendicular to the first direction DR1 and the second direction DR2. For convenience of description, the first and second floors 600_1 and 600_2 are illustrated as being separated from each other, but the first and second floors 600_1 and 600_2 may be in contact with each other. For example, the first and second floors 600_1 and 600_2 may be stacked on one semiconductor substrate.

The first floor 600_1 may include a plurality of banks 611_1 and 612_1 among other banks. The plurality of banks 611_1 and 612_1 may be arranged in the first direction DR1. The plurality of transfer elements 651 and 652 formed in a bank center area BCA may correspond to the plurality of banks 611_1 and 612_1, respectively. The structure of the first floor 600_1 may be substantially identical to the structure of the nonvolatile memory device 300 of FIG. 4.

The second floor 600_2 may include a plurality of banks 611_2 and 612_2 among other banks. The plurality of banks 611_2 and 612_2 may be arranged in the first direction DR1. The plurality of transfer elements 651 and 652 formed in the bank center area BCA may correspond to the plurality of banks 611_2 and 612_2, respectively.

For example, word lines (not shown) connected to the first floor 600_1 may be different from word lines (not shown) connected to the second floor 600_2. However, bit lines (not shown) may be shared between the first floor 600_1 and the second floor 600_2. The bit lines are disposed between the first floor 600_1 and the second floor 600_2. Write drivers may be shared between the first floor 600_1 and the second floor 600_2. As such, the plurality of transfer elements 651 and 652 may be shared between the first floor 600_1 and the second floor 600_2. For example, a program current may be provided to the first bank 611_1 of the first floor 600_1 and the first bank 611_2 of the second floor 600_2 through the first transfer element 651.

The program current generator 640 may be provided on a periphery of the nonvolatile memory device 600. A program current which the plurality of banks 611_1 and 612_1 included in the first floor 600_1 uses to perform the write operation may be different from a program current which the plurality of banks 611_2 and 612_2 included in the second floor 600_2 uses to perform the write operation. The program currents may be generated by one program current generator 640. A program current of the selected bank of the banks sharing one transfer element may be optimized by controlling the code of FIG. 6.

Although not illustrated in FIG. 11, the nonvolatile memory device 600 may further include switches for the purpose of operating in consideration of the standby mode and the activate mode, similar to the nonvolatile memory device 400 of FIG. 8. For example, the nonvolatile memory device 600 may be implemented in such a way that adjacent banks share one transfer element, similar to the nonvolatile memory device 500 of FIG. 10. Also, as described with reference to FIG. 5, transfer elements of the nonvolatile memory device 600 may be implemented with a simple current mirror circuit or a current mirror circuit of a cascade structure or a source degeneration structure.

Figure 12:
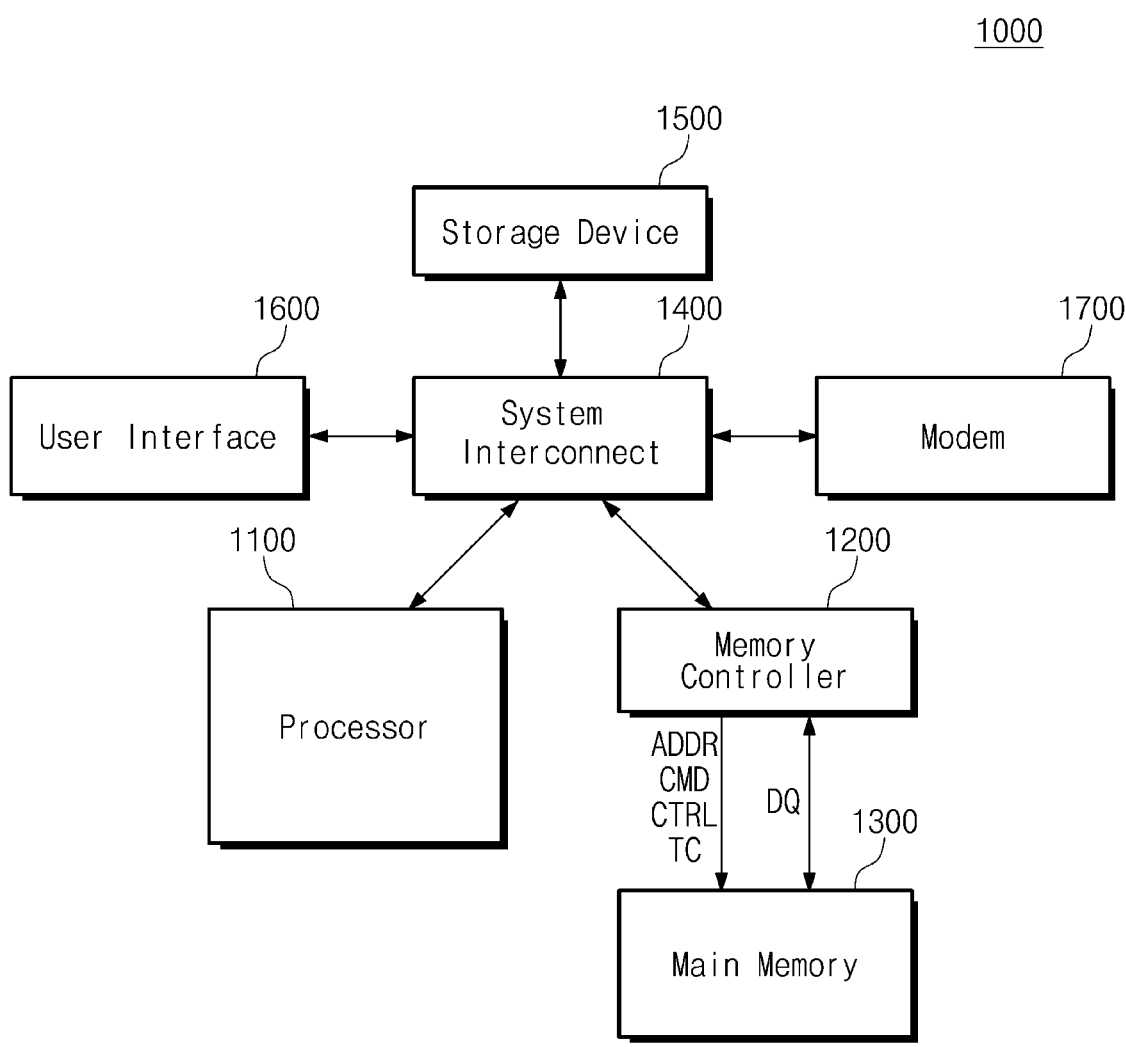
FIG. 12 illustrates a block diagram of a computing device according to an embodiment of the inventive concepts.

FIG. 12 illustrates a block diagram of a computing device according to an embodiment of the inventive concepts. Referring to FIG. 12, a computing device 1000 includes a processor 1100, a memory controller 1200, a main memory 1300, a system interconnect 1400, a storage device 1500, a user interface 1600, and a modem 1700. The computing device 1000 may be implemented with one of various computing devices such as for example a desktop computer, a notebook computer, a data server, an application server, a smartphone, and a smart tablet, or the like.

The processor 1100 may be a central processing unit (CPU) or an application processor (AP) which performs various operations. The processor 1100 controls the respective components of the computing device 1000 so as to perform a write operation, a read operation, or any other operation. For example, the processor 1100 may access the main memory 1300 by using the memory controller 1200.

The memory controller 1200 may control the main memory 1300 so as to perform the set operation, the reset operation, or the read operation under control of the processor 1100. For example, the memory controller 1200 may receive a write command from the processor 1100, and may control the main memory 1300 so as to perform a write operation on data signals DQ. For example, the memory controller 1200 may generate codes TC for generating program currents optimized according to bank locations.

The main memory 1300 may include one of nonvolatile memory devices described with reference to FIGS. 1 to 11. The main memory 1300 may receive an address ADDR, a command CMD, and control information CTRL from the memory controller 1200. The main memory 1300 may receive the codes TC for generating a plurality of program currents from the memory controller 1200. A program current generator included in the main memory 1300 may include a plurality of current adjusting transistors, and the plurality of current adjusting transistors may generate a plurality of program currents based on the codes TC. The main memory 1300 may exchange the data signals DQ with the memory controller 1200. The main memory 1300 may include phase change memory cells.

The system interconnect 1400 may provide channels between components of the computing device 1000. The system interconnect 1400 may be implemented in compliance with one of various standards such as peripheral component interconnect express (PCIe) and advanced microcontroller bus architecture (AMBA).

The storage device 1500 may function as a secondary memory of the computing device 1000. The storage device 1500 may have an access speed slower than the main memory 1300 and may have a storage capacity larger than the main memory 1300. The storage device 1500 may include for example a hard disk drive (HDD), a solid state drive (SSD), a portable memory, etc.

The user interface 1600 may exchange information with a user. The user interface 1600 may include a user input interface such as for example a keyboard, a mouse, a touch panel, a microphone, or other device which receives information from the user, and a user output interface such as for example a monitor, a speaker, a motor or other device which provides information to the user.

The modem 1700 is configured to perform wired or wireless communication with an external device. The modem 1700 may be configured to implement at least one of various standards such as long term evolution (LTE), Ethernet, wireless-fidelity (Wi-Fi), and Bluetooth. In an embodiment, the modem 1700 may be included within the processor 1100.

According to nonvolatile memory devices of the inventive concepts, error in a write operation may be decreased by positioning a transfer element for mirroring a program current in a bank center area.

While the inventive concepts have been described with reference to exemplary embodiments thereof, it will be apparent to those of ordinary skill in the art that various changes and modifications may be made thereto without departing from the spirit and scope of the inventive concepts as set forth in the following claims.

What is claimed is:

1. A nonvolatile memory device comprising:
a bank including a memory cell array and a transfer element,
wherein the memory cell array includes phase change memory cells storing data based on a program current, and
wherein the transfer element is configured to transfer the program current to the memory cell array through current mirroring;
a program current generator configured to generate the program current based on a reference current; and
a second bank including a second memory cell array storing data based on a second program current, and a second transfer element configured to transfer the second program current to the second memory cell array,
wherein the program current generator is further configured to generate the second program current based on the reference current, and
wherein the program current generator comprises
a reference current generator configured to generate the reference current, and
a current adjuster configured to generate the program current based on the reference current and a first code, and to generate the second program current based on the reference current and a second code.

2. The nonvolatile memory device of claim 1, wherein the transfer element comprises a mirror source transistor including a first terminal connected to receive the program current, a second terminal connected to receive a supply voltage, and a gate terminal connected to the first terminal.

3. The nonvolatile memory device of claim 1, wherein the bank further comprises a plurality of write drivers configured to mirror the program current from the transfer element to program a selected phase change memory cell of the memory cell array.

4. The nonvolatile memory device of claim 1, wherein the bank is divided into
a first memory area in which some of the phase change memory cells of the memory cell array are arranged;
a second memory area in which remaining phase change memory cells of the memory cell array other than the some of the phase change memory cells are arranged; and a bank center area interposed between the first memory area and the second memory area, wherein the transfer element is positioned in the bank center area.

5. The nonvolatile memory device of claim 1, wherein the current adjuster comprises:

a first current adjustment transistor connected to the reference current generator and configured to mirror the reference current to provide a first mirrored reference current and to adjust a level of the first mirrored reference current based on the first code to provide the program current; and a second current adjustment transistor connected to the reference current generator and configured to mirror the reference current to provide a second mirrored reference current and to adjust a level of the second mirrored reference current based on the second code to provide the second program current.

6. The nonvolatile memory device of claim 1, further comprising a switch configured to electrically connect the transfer element and the second transfer element in a standby mode, and to disconnect the transfer element from the second transfer element in an active mode during a program operation of the bank and the second bank.

7. The nonvolatile memory device of claim 6, wherein, in the standby mode, the program current generator is configured to output a standby current to one of the transfer element and the second transfer element, and wherein, in the active mode, the program current generator is configured to output the program current to the transfer element and output the second program current to the second transfer element.

8. The nonvolatile memory device of claim 1, wherein the bank and the second bank are arranged in a first direction, wherein the bank further comprises a plurality of first write drivers configured to mirror the program current from the transfer element to program a selected phase change memory cell of the memory cell array, the plurality of first write drivers are arranged in a second direction intersecting the first direction, and wherein the second bank comprises a plurality of second write drivers configured to mirror the second program current from the second transfer element to program a selected phase change memory cell of the second memory cell array, the plurality of second write drivers are arranged in the second direction.

9. The nonvolatile memory device of claim 8, wherein the transfer element is positioned adjacent to the plurality of first write drivers in the second direction, and wherein the second transfer element is positioned adjacent to the plurality of second write drivers in the second direction.

10. The nonvolatile memory device of claim 1, further comprising a fourth bank including a fourth memory cell array storing data based on the program current transferred from the transfer element.

11. The nonvolatile memory device of claim 10, further comprising a third bank including a third memory cell array storing data based on a third program current, and a third transfer element configured to transfer the third program current to the third memory cell array, and wherein the program current generator is further configured to generate the third program current based on the reference current.

12. A nonvolatile memory device comprising:

a peripheral circuit including a program current generator configured to generate a program current based on a reference current;

a bank configured to store data based on the program current, wherein the bank comprises a memory cell array, a transfer element configured to receive the program current from the program current generator, and a write driver configured to mirror the program current from the transfer element and to perform a write operation on a selected memory cell of the memory cell array; and a second bank interposed between the bank and the peripheral circuit, wherein the second bank comprises a second memory cell array, a second transfer element configured to receive a second program current from the program current generator, and a second write driver configured to mirror the second program current from the second transfer element and to perform a second write operation on a selected memory cell of the second memory cell array.

13. The nonvolatile memory device of claim 12, wherein the bank further comprises:

a fourth write driver configured to mirror the program current from the transfer element and to perform a fourth write operation on a second selected memory cell of the memory cell array, wherein the transfer element is interposed between the write driver and the fourth write driver.

14. The nonvolatile memory device of claim 12, further comprising a third bank interposed between the second bank and the peripheral circuit, wherein the third bank comprises:

a third memory cell array; and a third write driver configured to mirror the second program current from the second transfer element and to perform a third write operation on a selected memory cell of the third memory cell array.

15. The nonvolatile memory device of claim 12, wherein the bank is divided into a first memory area in which some of memory cells of the memory cell array are arranged;

a second memory area in which remaining memory cells of the memory cell array other than the some of the memory cells are arranged; and a bank center area interposed between the first memory area and the second memory area, wherein the transfer element is positioned in the bank center area.

16. A nonvolatile memory device comprising:

a first floor including a first bank performing a write operation based on a first program current;

a second floor including a second bank performing a write operation based on a second program current, the second floor positioned over the first floor;

a program current generator configured to generate the first program current and the second program current based on a reference current;

a first transfer element configured to transfer the first program current received from the program current generator to the first bank through current mirroring; and a second transfer element configured to transfer the second program current received from the program current generator to the second bank through current mirroring.

17. The nonvolatile memory device of claim 16, wherein the first floor further includes banks arranged in a first direction with respect to the first bank,
wherein the second floor further includes banks arranged in the first direction with respect to the second bank,
wherein each of the first bank and the second bank is extended in a second direction intersecting the first direction, and
wherein the first floor and the second floor are positioned adjacent to each other in a third direction intersecting the first and second directions.

* * * * *